United States Patent [19]
Liu

[11] Patent Number: 5,886,401
[45] Date of Patent: Mar. 23, 1999

[54] STRUCTURE AND FABRICATION METHOD FOR INTERCONNECTING LIGHT EMITTING DIODES WITH METALLIZATION EXTENDING THROUGH VIAS IN A POLYMER FILM OVERLYING THE LIGHT EMITTING DIODES

[75] Inventor: Yung Sheng Liu, Schenectady, N.Y.

[73] Assignee: General Electric Company, Schenectady, N.Y.

[21] Appl. No.: 921,960

[22] Filed: Sep. 2, 1997

[51] Int. Cl.⁶ .............................. G09G 3/32; G03H 1/00
[52] U.S. Cl. ............................ 257/678; 257/99; 257/88; 257/81; 257/98; 345/82; 345/84; 359/34; 385/14
[58] Field of Search .................... 257/678, 99, 88, 257/98, 668, 94, 723, 82, 79, 81; 372/45, 50; 347/238, 245; 345/84, 82, 46, 205, 206, 903, 905; 388/14, 37; 359/34

[56] References Cited

U.S. PATENT DOCUMENTS

| | | | |
|---|---|---|---|
| 4,783,695 | 11/1988 | Eichelberger et al. | 257/723 |
| 4,835,704 | 5/1989 | Eichelberger et al. | 364/490 |
| 4,894,115 | 1/1990 | Eichelberger et al. | 156/643 |
| 4,933,042 | 6/1990 | Eichelberger et al. | 156/239 |
| 4,984,034 | 1/1991 | Yamazaki | 257/88 |
| 5,113,232 | 5/1992 | Itoh et al. | 257/91 |
| 5,353,498 | 10/1994 | Fillion et al. | 29/840 |
| 5,386,623 | 2/1995 | Okamoto et al. | 29/832 |
| 5,455,459 | 10/1995 | Fillion et al. | 257/211 |
| 5,502,316 | 3/1996 | Kish et al. | 257/94 |
| 5,544,184 | 8/1996 | Wolak et al. | 257/98 |
| 5,563,422 | 10/1996 | Nakamura et al. | 257/13 |
| 5,637,907 | 6/1997 | Leedy | 257/434 |
| 5,638,469 | 6/1997 | Feldman et al. | 257/82 |
| 5,699,073 | 12/1997 | Lebby et al. | 257/99 |
| 5,748,161 | 5/1998 | Lebby et al. | 257/81 |

FOREIGN PATENT DOCUMENTS

| | | | |
|---|---|---|---|
| 402114 A | 12/1990 | European Pat. Off. | 257/99 |

*Primary Examiner*—Alexander Oscar Williams
*Attorney, Agent, or Firm*—Ann M. Agosti; Marvin Snyder

[57] ABSTRACT

A light emitting diode (LED) interconnection package includes an LED situated on a substantially transparent substrate, the LED having a contact surface with contact pads and having side surfaces; a polymer film overlying the contact surface and having via openings; a substantially transparent support piece surrounding the side surfaces of the LED and the substrate; and metallization overlying the polymer film and extending through the via openings for interconnecting the contact pads.

20 Claims, 2 Drawing Sheets

STRUCTURE AND FABRICATION METHOD FOR INTERCONNECTING LIGHT EMITTING DIODES WITH METALLIZATION EXTENDING THROUGH VIAS IN A POLYMER FILM OVERLYING THE LIGHT EMITTING DIODES

BACKGROUND OF THE INVENTION

The present invention relates generally to high density packaging and interconnecting of light emitting diodes (LEDs).

To more effectively use solid state LED-based light sources for lighting applications, a low-cost packaging and interconnect technology must be developed. Substrates used in the growth of blue-green LEDs such as GaN (gallium nitride)-based compound semiconductor devices are typically insulating materials such as aluminum oxide ($Al_2O_3$). Because a substrate is an insulating material, the electrical contacts are fabricated on the top surface of the device. This type of packaging and interconnect configuration has the drawback of low device packaging density.

In conventional packaging methods, such as Nakamura et al., U.S. Pat. No. 5,563,422, issued 8 Oct. 1996, wherein a GaN-based device is packaged in a housing unit with contact electrodes, the LED device has a transparent and electrically insulating substrate. After contacts are fabricated on the LED, bonding pads are formed of gold, and the device is mounted on top of a lead frame structure. Typically these LED devices are mounted into epoxy domes and situated at a focal point of a parabolic shaped lead frame. Bonding wires can be used to connect LED electrode contacts and the lead frame.

These packages are adequate for applications in which a high packaging density is not required, but several drawbacks result from using lead frames. For example, the device packaging is typically limited to two to three devices per centimeter because of the wire bonds and lead frames. Typically, the lead frame is enclosed inside an epoxy dome having a diameter of a few millimeters. Because the device is placed on top of substrate that is thermally insulated, the only thermal path is the bonding wires in contact with the lead frame. Optical coupling efficiency is reduced because light escaping from the junction has to transmit through the semi-transparent electrode or be bounced from the bottom in contact with the lead frame. Additionally, a two dimensional array of LEDs with a high packaging density is difficult to achieve with wire bonds.

SUMMARY OF THE INVENTION

It is therefore seen to be desirable to provide a packaging structure for an LED with enhanced optical output coupling efficiency, improved thermal management, two dimensional array capabilities, and improved packaging density with its associated higher light generation per unit.

Briefly, in one embodiment, a light emitting diode (LED) interconnection package includes an LED situated on a substantially transparent substrate, the LED having a contact surface with contact pads and having side surfaces; a polymer film overlying the contact surface and having via openings; a substantially transparent support piece surrounding the side surfaces of the LED and the substrate; and metallization overlying the polymer film and extending through the via openings for interconnecting the contact pads.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
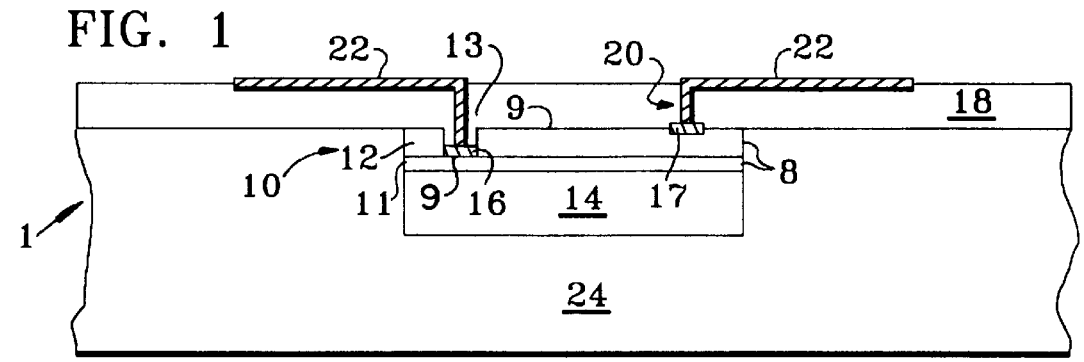
FIGS. 1–4 are sectional side views of LEDs packaged according to the present invention.

FIG. 1 is a sectional side view of a package 1 including an LED 10 grown on a transparent substrate 14. For purposes of example, LED 10 comprises an n type semiconductor layer 11 underlying a p type semiconductor layer 12. In one embodiment, the semiconductor layers comprise gallium nitride having a thickness ranging from about 0.1 micrometers to about ten (10) micrometers. Two bonding pads 16 and 17 are attached to semiconductor layers 11 and 12, respectively, on a contact surface 9 of the LED. The bonding pads typically comprise one or more layers of metals such as gold, nickel, aluminum, platinum, chromium, indium, and/or tin, for example.

Substrate 14 may comprise a substantially transparent material such as silicon carbide or aluminum oxide for example. "Substantially transparent" is intended to mean sufficiently transparent to transmit a useful amount of light therethrough. The thickness of the substrate is not a critical factor and will depend upon the particular application. In one embodiment the thickness ranges from about 250 micrometers to about 750 micrometers.

Figure 2:
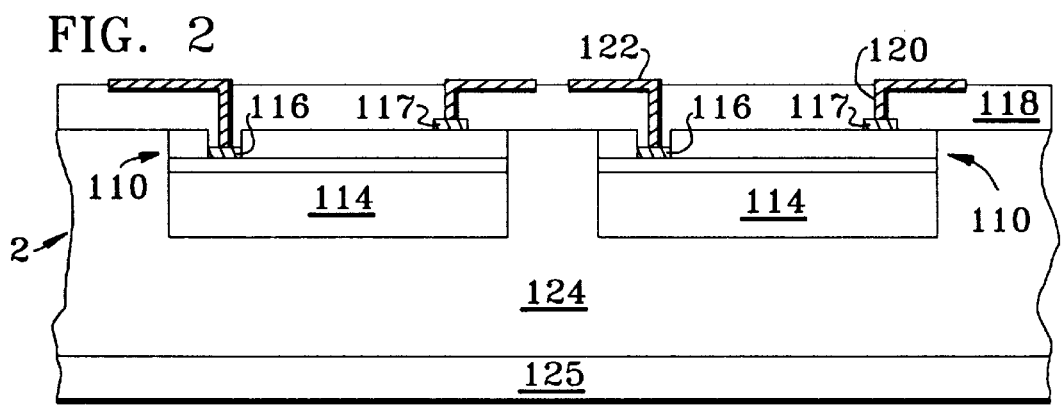
Figure 3:
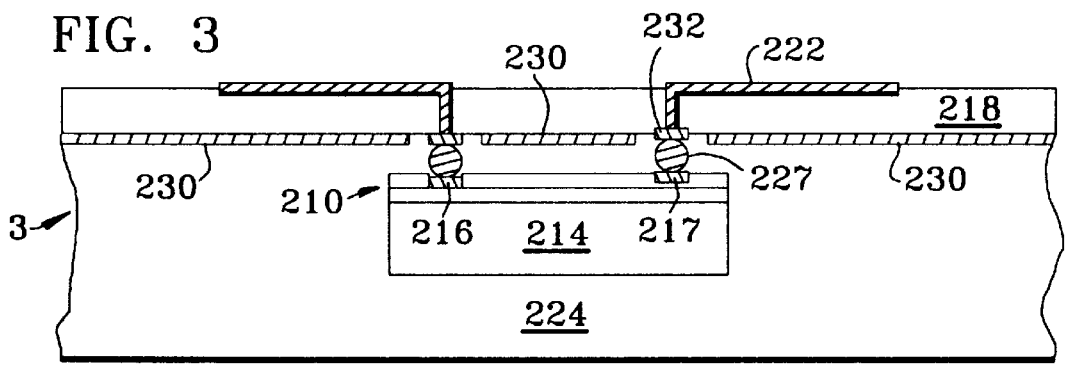
Figure 4:
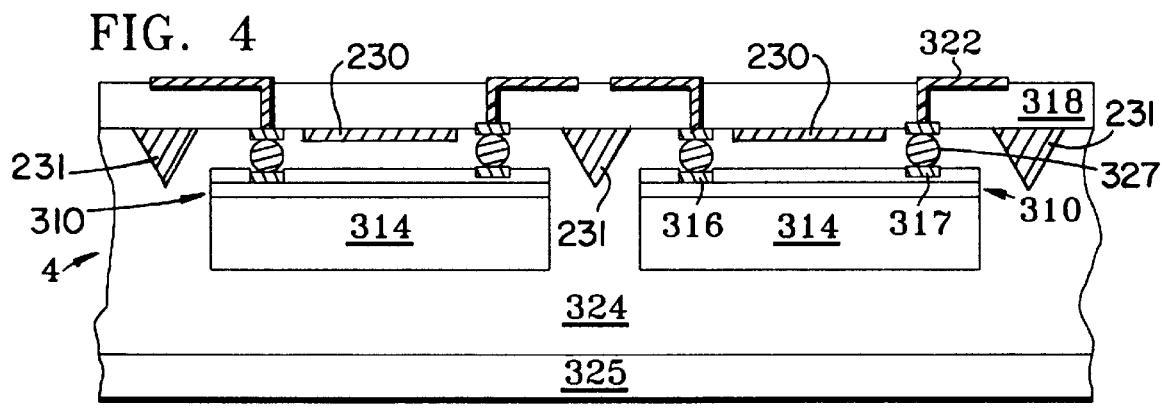

LED device 10 is attached to a polymer layer 18 directly or through an adhesive or, as shown in FIGS. 3 and 4, through solder connections. In FIGS. 1 and 2, the polymer layer provides an insulated layer upon which is deposited a metallization pattern for direct interconnection of LEDs through the vias. The polymer layer comprises an electrically insulating material upon which an electrically conductive material can adhere such as, for example, KAPTON polyimide (KAPTON is a trademark of E. I. du Pont de Nemours & Co.), APICAL AV polyimide (APICAL is a trademark of Kanegafugi Chemical Industry Company.), or UPILEX polyimide (UPILEX is a trademark or UBE Industries, Ltd. Methods for applying polymer layers (in the context of interconnecting circuit chips) are further described in Eichelberger et al., U.S. Pat. No. 4,783,695, issued Nov. 8, 1988, and in Eichelberger et al., U.S. Pat. No. 4,933,042, issued Jun. 12, 1990. In one embodiment, the polymer comprises KAPTON polyimide having a thickness of about 25 micrometers.

Vias openings 20 extending through the polymer layer to chip pads can be formed by any appropriate process. A preferred method of laser-drilling via openings in the polymer film is described in Eichelberger et al., U.S. Pat. No. 4,894,115, issued Jan. 16, 1990

Metallization 22 can be applied over the polymer layer and into the via openings to extend to contact pads 16 and 17. The metallization comprises an electrically conductive material and can be applied using vacuum deposition, for example, by sequentially sputtering a thin seed layer of titanium or $SnCl_2$ (for adhesion purposes), sputtering a thin layer of copper, and electroplating a thicker layer of copper (typically ranging from three to ten micrometers) before being patterned with photoresist to provide the desired connections. If desired, the electroplated layer can be coated with another thin layer of adhesion promoting material such as titanium. In one embodiment an adaptive lithography system is used to provide interconnection patterns as described in Eichelberger et al., U.S. Pat. No. 4,835,704.

A substantially transparent support piece 24 can be positioned to surround the LED and substrate either before or after metallization 22 is applied. In one embodiment a substantially transparent epoxy compound 24 is used to encapsulate the LED and substrate. If the epoxy compound and substrate are thin and flexible, the encapsulated device will comprise a flexible assembly. In another embodiment, the support piece is formed prior to LED insertion, wells are fabricated in the support piece, and LEDs are inserted either before or after metallization 122 is applied.

If an epoxy compound is used, the formation of vias and metallization can occur either before or after encapsulation. An advantage to forming the vias and metallization patterns after encapsulation is that the surfaces of the flexible interconnect layers are relatively planar.

In one embodiment, the LED and substrate are positioned with the contact surface down on the polymer layer and a mold form (not shown) is positioned around the LED and substrate with epoxy next being introduced in the mold form. Various methods for molding are discussed in Fillion et al., U.S. Pat. No. 5,353,498, which describes a method for fabricating an integrated circuit module by molding substrate material directly to semiconductor chips. In another embodiment, the substrate and side surfaces 8 of the LED are encapsulated prior to attaching the LED and the polymer layer.

Figure 5:
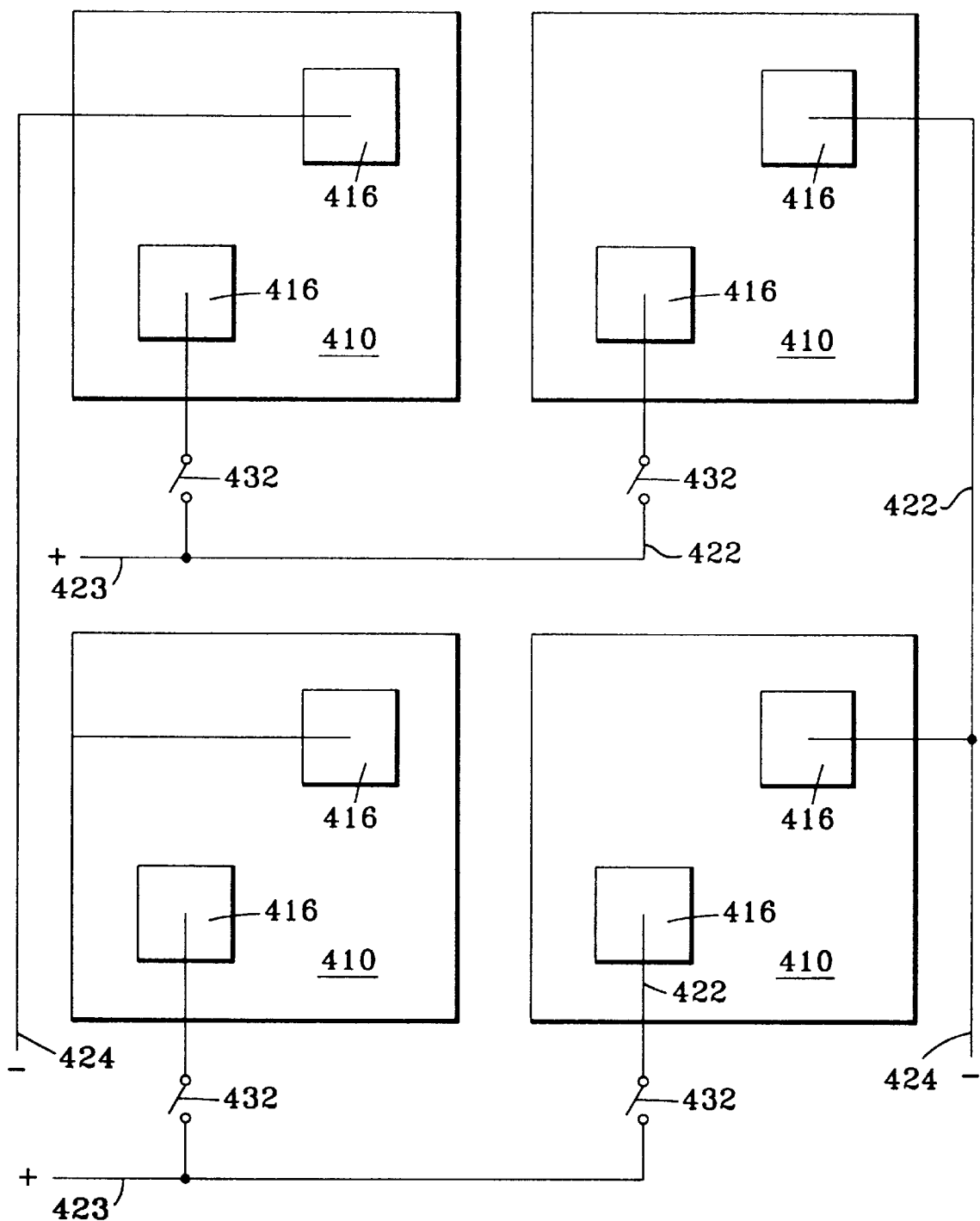
FIG. 5 is a top view of an array of LEDs packaged according to the present invention.

A variation 2 of the packaging structure is shown in FIG. 2 in which an array of LEDs 114 is die attached to a polymer film. Metallization 122 can be applied as discussed with respect to metallization 22 in FIG. 1 to interconnect contact pads 116 and 117 of the LEDs. A top view of an array is shown in FIG. 5.

A phosphor layer 125 can be coated to the outer surface of epoxy compound 124 to convert the emission to different colors or to white light by color mixing. The appropriate thickness of the phosphor layer will depend on the colors of LED and the absorption properties and thicknesses of the phosphors. With this packaging structure, for a die size of 500 micrometer×500 micrometer, a packaging density of 20 devices per linear centimeter and 400 devices per square centimeter can be achieved.

Another variation 3 of this packaging structure is shown in FIG. 3 in which the LED 210 is "flip-chip" attached to polymer layer 218 with solder balls 227. In this embodiment, the polymer layer is pre-metallized with metallization 222 and bonding pads 232. As discussed in FIG. 1, the epoxy compound 224 can be applied to attach the polymer layer and the LED and provide electrical interconnections.

An optional feature of the embodiment of FIG. 3, as well as the embodiments of FIGS. 1, 2, and 4 is to apply a reflector which may comprise a reflective layer 230 as shown in FIG. 3 (and/or a reflective structure 231 as shown in FIG. 4) on the surface of the polymer layer which will face the LED.

In one embodiment, for example, the reflective layer comprises a metal such as copper, gold, or aluminum having a thickness in the range of about 0.1 micrometers to about 1 micrometer. The reflector may include both reflective layers and reflective structures used to enhance the reflection and collection efficiency of the polymer layer. If a metal is used, the reflective layer should not extend to the vicinity of bonding pads 227 in FIG. 3 or the anticipated locations of contact pads 16 and 17 in FIG. 1. The reflective layer is useful for reflecting light in a desired direction. If a support piece 224 is formed with a well for insertion of LED 210 and substrate 214, the reflective layer can be patterned on the support piece instead of the polymer layer, if desired.

Another variation 4 of this packaging structure is shown in FIG. 4 in which a plurality of LEDs are attached to polymer layer 318 by solder balls 327 and a phosphor layer 325 is applied to epoxy compound 234. FIG. 4 additionally illustrates a reflector comprising a plurality of reflective structures 231 which may comprise similar materials as discussed with respect to the reflective layer, for example. In one embodiment, the reflective structures can be prefabricated and encapsulated in an epoxy compound with the LED and the substrate.

FIG. 5 is a top view of an array of LEDs 410 having chip pads 416 which are covered by a polymer layer (not shown) through which interconnections can be made by metallization 422 to positive voltage lines 423 and negative voltage lines 424. In the example of FIG. 5, the LEDs can be turned on through switches 432 which are coupled to positive lines 423. The switches may comprise mechanical switches, electromechanical switches, or electronic switches, for example.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

I claim:

1. A light emitting diode (LED) interconnection package comprising:
    an LED grown on a substantially transparent substrate, the LED having a contact surface with contact pads and having side surfaces;
    a polymer film overlying the contact surface and having via openings;
    a substantially transparent support piece surrounding the side surfaces of the LED and the substrate; and
    metallization overlying the polymer film and extending through the via openings for interconnecting the contact pads.

2. The package of claim 1 wherein the support piece comprises an epoxy compound.

3. The package of claim 2 wherein the metallization extends through the via openings to the contact pads.

4. The package of claim 2 wherein the metallization extends through the via openings to bonding pads on the polymer film and wherein solder couples the bonding pads to the contact pads.

5. The package of claim 2 further comprising a reflector situated on a surface of the polymer film facing the LED.

6. The package of claim 2 further comprising a phosphor layer coated on a surface of the epoxy compound facing away from the LED.

7. A light emitting diode (LED) array interconnection package comprising:
    a plurality of LEDs grown on substantially transparent substrates, the LEDs having a contact surfaces with contact pads and having side surfaces;
    a polymer film overlying the contact surfaces and having via openings;
    a substantially transparent support piece surrounding the side surfaces of the LEDs and the substrates; and metallization overlying the polymer film and extending through the via openings for interconnecting the contact pads.

8. The package of claim 7 wherein the metallization extends through the via openings to the contact pads.

9. The package of claim 7 wherein the metallization extends through the via openings to bonding pads on the polymer film and wherein solder couples the bonding pads to the contact pads.

10. The package of claim 7 further comprising a reflector situated on a surface of the polymer film facing the LED.

11. The package of claim 10 further comprising a phosphor layer coated on a surface of the epoxy compound facing away from the LED.

12. A fabrication method for a interconnecting at least one light emitting diode (LED) having contact pads situated on a contact surface, the method comprising:

attaching the contact surface of the LED and a polymer film; forming via openings in the polymer film;

applying a substantially transparent support piece around side surfaces of the LED and the substrate; and applying metallization over the polymer film and through the via openings to interconnect the contact pads.

13. The method of claim 12 wherein applying a substantially transparent support piece around side surfaces of the LED and the substrate comprises molding a substantially transparent epoxy compound.

14. The method of claim 13 wherein applying metallization comprises depositing metallization through the via openings to the contact pads.

15. The method of claim 13 wherein applying metallization comprises applying metallization through the via openings to bonding pads and wherein attaching the contact surface of the LED and the polymer comprises soldering the bonding pads to the contact pads.

16. The method of claim 13 further comprising applying a reflector on a surface of the polymer film facing the LED prior to attaching the contact surface of the LED and the polymer film.

17. The method of claim 16 wherein applying metallization comprises depositing metallization through the via openings to the contact pads.

18. The method of claim 16 wherein applying metallization comprises applying metallization through the via openings to bonding pads on the polymer film and soldering the bonding pads to the contact pads.

19. The method of claim 12, wherein applying the support piece occurs after attaching the contact surface of the LED and the polymer film.

20. The method of claim 12, wherein applying the support piece occurs before attaching the contact surface of the LED and the polymer film.

* * * * *